United States Patent
Chang et al.

(10) Patent No.: US 8,228,705 B2
(45) Date of Patent: Jul. 24, 2012

(54) MEMORY CELL AND AN ASSOCIATED MEMORY DEVICE

(75) Inventors: Soon-Jyh Chang, Tainan (TW); Ming-Liang Chung, Tainan (TW); Po-Ying Chen, Tainan (TW); Chung-Ming Huang, Tainan (TW)

(73) Assignees: Himax Technologies Limited, Tainan County (TW); NCKU Research and Development Foundation, Tainan (TW)

( * ) Notice: Subject to any disclaimer, the term of this patent is extended or adjusted under 35 U.S.C. 154(b) by 337 days.

(21) Appl. No.: 12/765,770

(22) Filed: Apr. 22, 2010

(65) Prior Publication Data

US 2011/0261604 A1 Oct. 27, 2011

(51) Int. Cl.
*G11C 5/06* (2006.01)
*G11C 11/00* (2006.01)
*G11C 7/00* (2006.01)

(52) U.S. Cl. .......... 365/72; 365/154; 365/202; 365/203; 365/205

(58) Field of Classification Search .................. 365/72, 365/154, 155, 156, 202, 203, 205
See application file for complete search history.

(56) References Cited

U.S. PATENT DOCUMENTS

| | | | | |
|---|---|---|---|---|
| 7,161,826 | B2 * | 1/2007 | Hsu et al. ............... | 365/154 |
| 7,269,057 | B2 * | 9/2007 | Haddad et al. ............... | 365/156 |
| 7,589,992 | B2 * | 9/2009 | Han et al. ............... | 365/154 |
| 2006/0013035 | A1 * | 1/2006 | Hsu et al. ............... | 365/154 |

* cited by examiner

*Primary Examiner* — Ly D Pham
(74) *Attorney, Agent, or Firm* — Stout, Uxa, Buyan & Mullins, LLP

(57) ABSTRACT

A memory cell includes a pair of sub-cells, each including an access transistor, a storage transistor, and an isolation transistor that are serially coupled in sequence with their source/drain connected. The isolation transistor is shared with a sub-cell of an adjacent memory cell and always turned off, wherein the storage transistor is always turned on. A wordline is coupled to a gate of the access transistor of each sub-cell, and complementary bit lines are respectively coupled to sources/drains of the access transistors of the pair of sub-cells, such that data bit may be accessed between the bit line and the corresponding storage transistor through the corresponding access transistor.

16 Claims, 5 Drawing Sheets

MEMORY CELL AND AN ASSOCIATED MEMORY DEVICE

BACKGROUND OF THE INVENTION

1. Field of the Invention

The present invention generally relates to semiconductor memory, and more particularly to a 3-transistor-2-capacitor (3T2C) dynamic random access memory (DRAM) cell.

2. Description of Related Art

Semiconductor memory is one of the most commonly used data storage media. Examples of the semiconductor memory include, among others, dynamic random access memory (DRAM) and static random access memory (SRAM). The semiconductor memory itself may be manufactured as an integrated circuit, or may be integrated with other components to form, for example, a system on chip (SOC).

For modern SOC applications, a substantial portion, e.g., 60% to 70%, of the circuit area is dedicated to the memory. The selection of the type and technology of the memory thus plays an important role in the overall performance and cost in the entire chip.

Some SOCs employ DRAM technology in forming the data storage media. FIG. 1A schematically shows one conventional DRAM cell, which includes a storage capacitor Cs and an access transistor Ta. Due to its simple structure, DRAM has higher density, for example, than SRAM. However, the conventional DRAM need be fabricated in a specific manufacturing process in order to enlarge the capacitance of the storage capacitor Cs with small silicon area. Such specific manufacturing process is, unfortunately, not compatible with the SOC process, therefore increasing the overall fabrication cost.

Some other SOCs employ SRAM technology in forming the data storage media. FIG. 1B schematically shows one conventional SRAM cell, which includes two cross-coupled inverters 10 and two access transistors Tb and Tc. Unlike DRAM, SRAM has a manufacturing process that is generally compatible with the SOC process, but has lower density than DRAM. Further, as shown in FIG. 1B, due to the fact that the cross-coupled inverters 10 are directly coupled to power Vdd and ground, the SRAM cell is thus prone to power-incurred noise.

Accordingly, a need has arisen to propose a novel memory structure that may be fabricated, for example, in standard complementary-metal-oxide-semiconductor (CMOS) process to reduce the fabrication cost, while the high density may be also substantially maintained.

SUMMARY OF THE INVENTION

In view of the foregoing, it is an object of the present embodiment of the invention to provide a memory cell structure and an associated DRAM device with substantially high density that is, for example, adaptable to silicon-on-chip (SOC) process and is more immune to power-incurred noise.

According to one embodiment, a memory cell includes a pair of sub-cells, each sub-cell including an access transistor, a storage transistor, and an isolation transistor that are serially coupled in sequence with their source/drain connected. The isolation transistor is shared with a sub-cell of an adjacent memory cell and always turned off. The storage transistor is always turned on. A wordline is coupled to a gate of the access transistor of each sub-cell, and complementary bit lines are respectively coupled to sources/drains of the access transistors of the pair of sub-cells, such that data bit may be accessed between the bit line and the corresponding storage transistor through the corresponding access transistor.

According to another embodiment, a memory device includes a number of memory cells as described above. Each memory cell further includes a precharge circuit and a sense amplifier. The precharge circuit, when activated, is configured to precharge the complementary bit lines toward power. The sense amplifier, when activated, is configured to drive the complementary bit lines toward the power and ground respectively.

DETAILED DESCRIPTION OF THE INVENTION

Figure 2:
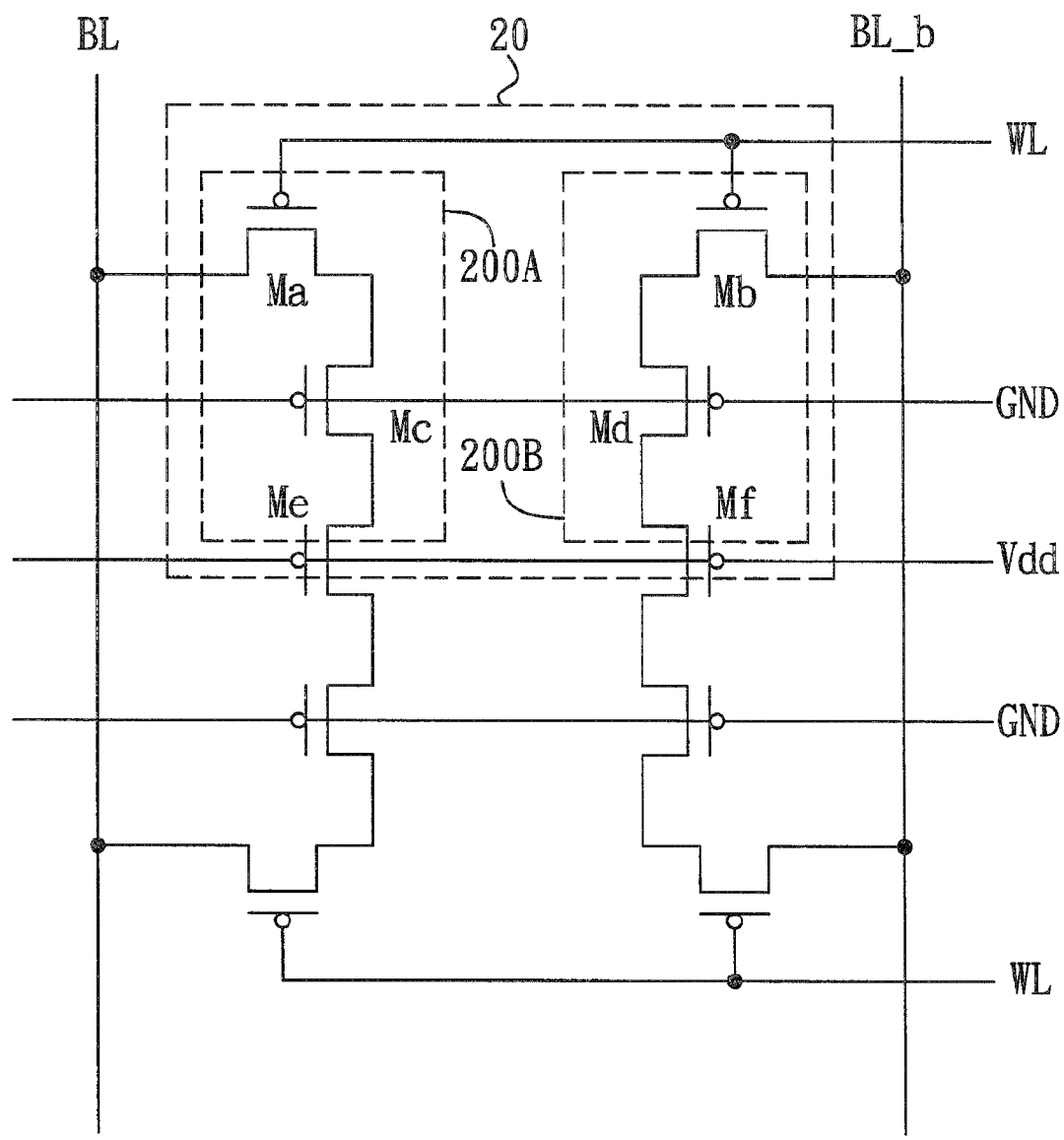
FIG. 2 shows a circuit diagram that illustrates representative memory cells of a dynamic random access memory (DRAM) according to one embodiment of the present invention.

FIG. 2 shows a circuit diagram that illustrates representative memory cells 20 of a dynamic random access memory (DRAM) according to one embodiment of the present invention. In the embodiment, a differential architecture is adopted to store complementary bits in each memory cell 20. Specifically, the memory cell 20 includes a pair of sub-cells 200A and 200B. The first sub-cell 200A includes an access transistor Ma, a storage transistor Mc and an isolation transistor Me. Similarly, the second sub-cell 200B includes an access transistor Mb, a storage transistor Md and an isolation transistor Mf. Although P-type metal-oxide-semiconductor (MOS) transistors are used in the embodiment, it is appreciated that N-type MOS transistors may be used instead, or their combination may be used. It is noted that the isolation transistors Me and Mf are respectively shared with the sub-cells of an adjacent memory cell. In other words, the first sub-cell 200A in fact includes only half of the isolation transistor Me, and the second sub-cell 200B in fact includes only half of the isolation transistor Mf. Accordingly, each memory cell 200 includes two access transistors, two storage transistors that are used as capacitors, and one isolation transistor in total. The memory cell according to the embodiment may thus be named 3T2C memory cell or 5T memory cell.

With respect to the sub-cell, for example, the first sub-cell 200A, the access transistor Ma, the storage transistor Mc and the isolation transistor Me are serially coupled in sequence with their source/drain connected, either directly or indirectly. It is noted that the source and the drain of a symmetrical MOS transistor are generally interchangeable, and therefore the source and the drain of each transistor are not distinctly described in the specification and marked in the drawings. The term "source/drain" is thus used in the specification to denote the source or the drain. Moreover, the term "couple" or "connect" in the specification may refer to two components that are directly wired together or are indirectly wired together via one or more other intermediate components.

In the embodiment, the gates of the access transistors Ma and Mb are coupled to a wordline WL. The sources/drains of the access transistors (Ma and Mb) that are not connected to the storage transistors (Mc and Md) are coupled to complementary bit lines BL and BL_b respectively. Therefore, charge may be accessed between the bit line BL/BL_b and the corresponding storage transistor Mc/Md through the corresponding access transistor Ma/Mb. The gates of the storage transistor (Mc and Md) are coupled to ground GND. The gates of the isolation transistors (Me and Mf) are coupled to power Vdd. The sources/drains of the isolation transistors (Me and Mf) that are not connected to the storage transistors (Mc and Md) are respectively coupled to the storage transistors of the sub-cells of an adjacent memory cell.

According to the configuration described above, as the storage transistors Mc and Md are always turned on, an inversion layer is thus formed at the semiconductor-oxide interface wherein electrons, or, generally speaking, carriers opposite to the majority carriers, are generated. The inversion layer is thus used in the embodiment to store data bit. The capacitance of the storage transistor Mc or Md is determined according to its parasitic capacitance. With the adopted differential architecture, if data bit 0 is stored in one storage transistor, say Mc, data bit 1 is then stored in another storage transistor, say Md. Moreover, as the isolation transistors Me and Mf are always turned off, the stored data thus can be isolated from the adjacent memory cell.

Figure 3A:
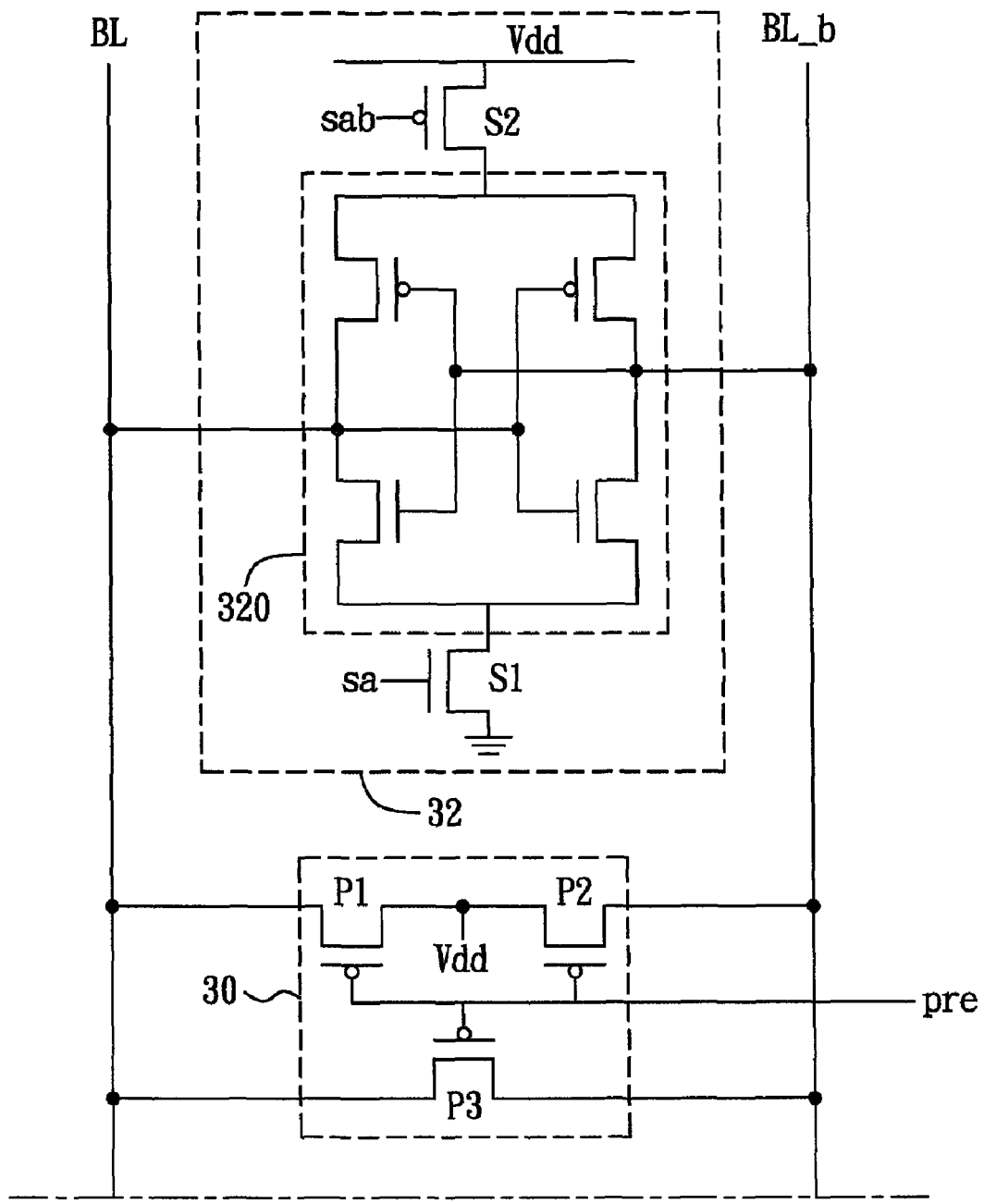
FIG. 3A shows a memory device that illustrates the memory cells of FIG. 2 along with a precharge circuit and a sense amplifier according to one embodiment of the present invention.
Figure 3A:
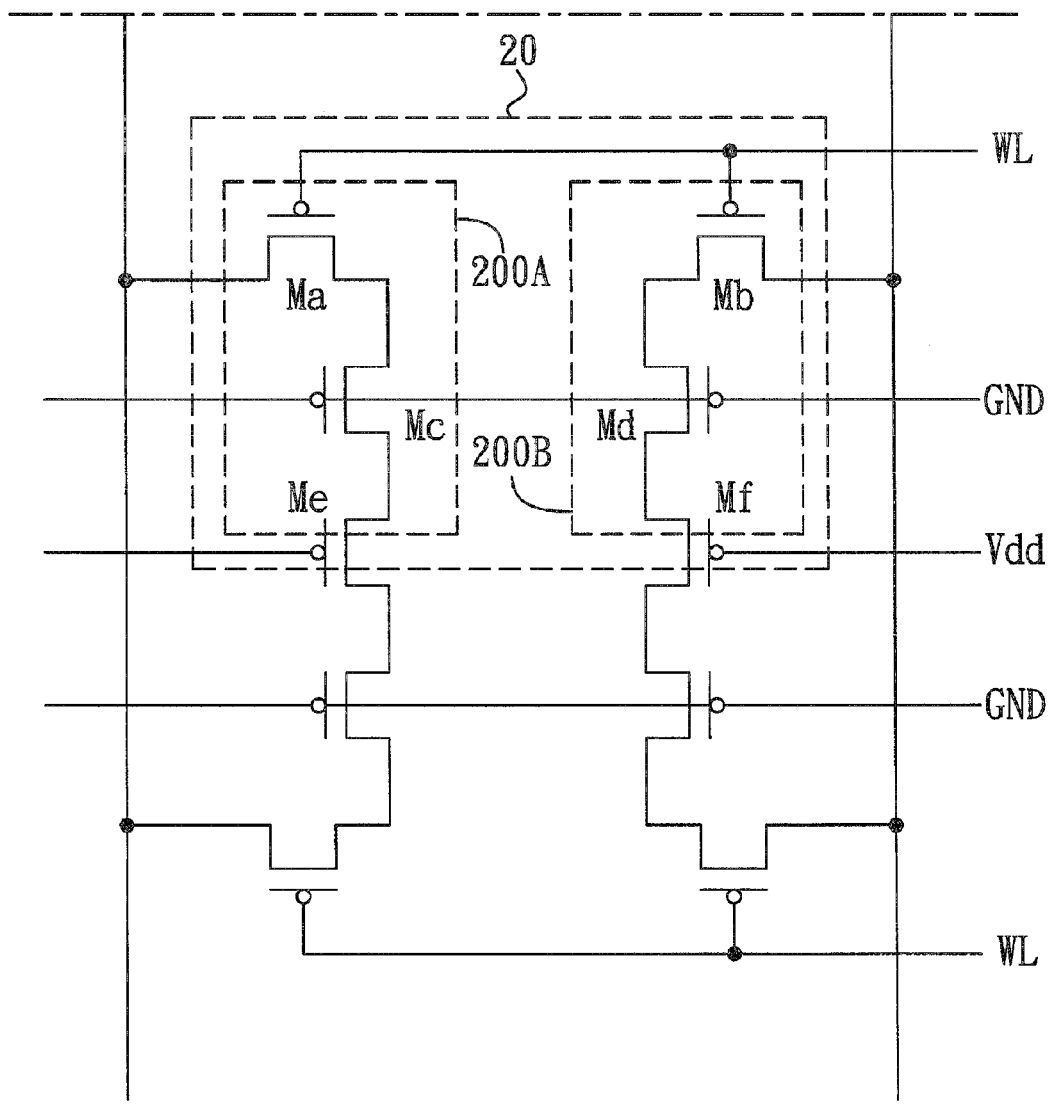

FIG. 3A shows a memory device that illustrates the memory cells 20 of FIG. 2 along with a precharge circuit 30 and a sense amplifier 32 according to one embodiment of the present invention. In the embodiment, the precharge circuit 30 includes three precharge transistors P1, P2 and P3, among which the first and the second precharge transistors P1 and P2 are serially connected and are further coupled between the complementary bit lines BL and BL_b. The connected sources/drains between the first and the second precharge transistors P1 and P2 are coupled to the power Vdd (or a voltage level). The source and drain of the third precharge transistor P3 are coupled to the complementary bit lines BL and BL_b respectively. The gates of the three precharge transistors P1, P2 and P3 are coupled to a precharge signal (pre). Although P-type MOS transistors are used in the embodiment, it is appreciated that N-type MOS transistors may be used instead, or their combination may be used. It is appreciated by those skilled in the pertinent art that the composing components and the configuration of the precharge circuit 30 are not limited to that shown in the figure, and the precharge circuit 30 may be replaced by other conventional precharge circuit.

In the embodiment, the sense amplifier 32 includes two cross-coupled inverters 320, a first sense (e.g., N-type MOS) transistor S1 and a second sense (e.g., P-type MOS) transistor S2. Specifically, the second sense transistor S2, the two cross-coupled inverters 320 and the first sense transistor S1 are serially coupled in sequence between the power Vdd and the ground GND. The gate of the first sense transistor S1 is driven by a first sense signal sa, and the gate of the second sense transistor S2 is driven by a second sense signal sab. The inputs of the two cross-coupled inverters 320 are coupled to the complementary bit lines BL and BL_b respectively. It is appreciated by those skilled in the pertinent art that the composing components and the configuration of the cross-coupled inverters 320 are not limited to that shown in the figure, and the cross-coupled inverters 320 may be replaced by other conventional sense amplifier.

Figure 3B:
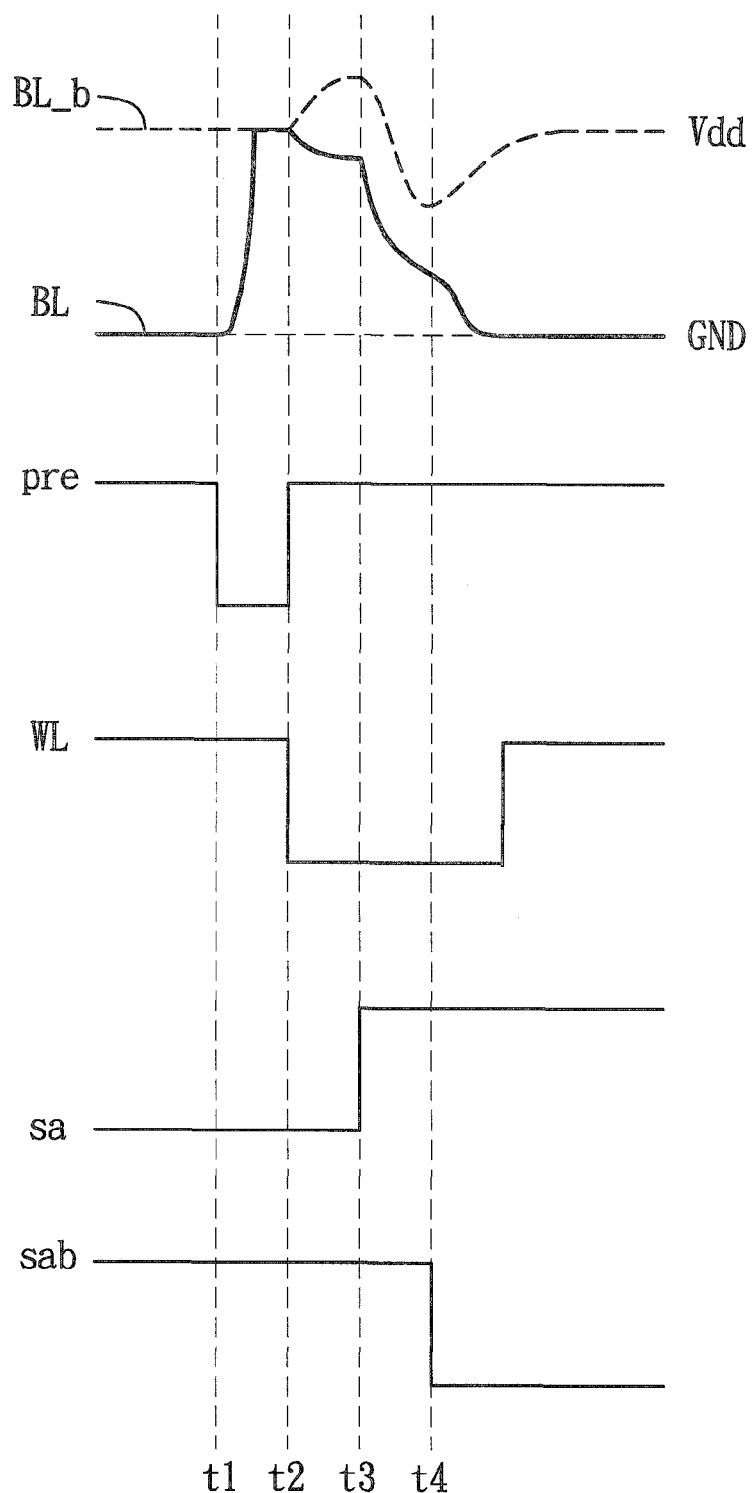
FIG. 3B shows exemplified waveforms associated with the memory device of FIG. 3A.

The read operation of the memory device in FIG. 3A is described below with reference to waveforms exemplified in FIG. 3B. The precharge circuit 30 is turned on at time t1 by driving the precharge signal (pre) to active low level. As a result, the complementary bit lines BL and BL_b are precharged toward the power Vdd. Subsequently, the precharge circuit 30 is turned off (by driving the precharge signal (pre) back to inactive high level) and the wordline WL of a selected row is driven to active low level at time t2. Stored charge is shared between the selected sub-cell (e.g., 200A) and its corresponding bit line (e.g., BL). As a result, the voltage level on the bit lines BL/BL_b will be slightly altered, and there will be a voltage swing between the bit lines BL and BL_b. Afterwards, the sense amplifier 32 is turned on by firstly driving the first sense signal sa to active high level at time t3, therefore driving (or discharging) the down-swing bit line, e.g., BL as shown in FIG. 3B, further toward to low level. Next, at time t4, the second sense signal sab is driven to active low level, therefore driving (or charging) the up-swing bit line, e.g., BL_b, further toward to high level. During the sense amplification, the two cross-coupled inverters 320 reinforce each other to act as a latch in order to drive the bit lines BL and BL_b toward full swing, i.e., to GND and Vdd respectively.

With respect to the write operation of the memory device in FIG. 3A, the bit lines BL and BL_b are driven to the power Vdd and the ground GND by the data to be written. In one embodiment, the write operation may be performed without activating the precharge circuit 30 and the sense amplifier 32. In another embodiment, the precharge circuit 30 and the sense amplifier 32 are activated according to the operation described above and exemplified in FIG. 3B. In the latter case, the write operation and the read operation of the same selected row (with the same wordline WL) may be performed at the same time using the same procedure. This is advantageous, during the write operation, to have the memory cells other than the writing cells to be re-read, such that decay (if any) in the stored charge may be refreshed.

Figure 1A:
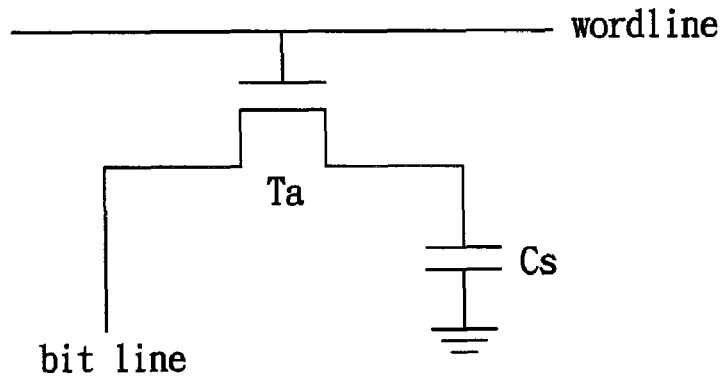
FIG. 1A schematically shows one conventional DRAM cell.
Figure 1B:
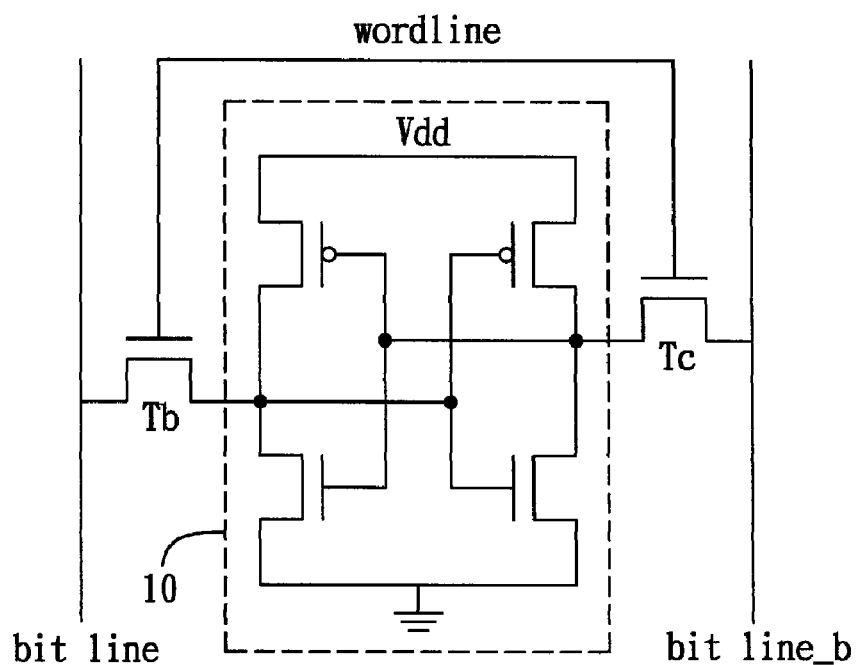
FIG. 1B schematically shows one conventional SRAM cell.

According to the embodiment described above, a differential architecture is adopted, and the capacitors of DRAM may be precluded to facilitate the integration of the memory and the system, for example, in SOC. Moreover, the memory cell of the embodiment has a structure (FIG. 2) simpler than conventional SRAM cell (FIG. 1B). Further, as the storage transistors Mc and Md (FIG. 2) are not directly coupled to the power Vdd and the ground GND, the embodiment becomes more immune to power-incurred noise than the conventional SRAM cell (FIG. 1B).

Although specific embodiments have been illustrated and described, it will be appreciated by those skilled in the art that various modifications may be made without departing from the scope of the present invention, which is intended to be limited solely by the appended claims.

What is claimed is:

1. A memory cell, comprising:
   a pair of sub-cells, each sub-cell including an access transistor, a storage transistor, and an isolation transistor that are serially coupled in sequence with their source/drain connected, wherein the isolation transistor is shared with a sub-cell of an adjacent memory cell and always turned off, wherein the storage transistor is always turned on;
   a wordline coupled to a gate of the access transistor of each said sub-cell; and
   complementary bit lines respectively coupled to sources/drains of the access transistors of the pair of sub-cells, such that data bit may be accessed between the bit line and the corresponding storage transistor through the corresponding access transistor.

2. The memory cell of claim 1, wherein the sources/drains of the access transistors that are not connected to the storage transistors are coupled to the complementary bit lines respectively.

3. The memory cell of claim 1, wherein the access transistor, the storage transistor and the isolation transistor are N-type metal-oxide-semiconductor (MOS) transistors.

4. The memory cell of claim 1, wherein the access transistor, the storage transistor and the isolation transistor are P-type metal-oxide-semiconductor (MOS) transistors.

5. The memory cell of claim 4, wherein a gate of the storage transistor is coupled to ground.

6. The memory cell of claim 4, wherein a gate of the isolation transistor is coupled to power.

7. The memory cell of claim 1, wherein complementary data bits are respectively stored in the storage transistors of the pair of the sub-cells.

8. The memory cell of claim 1, wherein the sources/drains of the isolations transistors that are not connected to the storage transistors are respectively coupled to the storage transistors of the sub-cells of the adjacent memory cell.

9. A memory device, comprising:
a plurality of memory cells, each memory cell including:
a pair of sub-cells, each sub-cell including an access transistor, a storage transistor, and an isolation transistor that are serially coupled in sequence with their source/drain connected, wherein the isolation transistor is shared with a sub-cell of an adjacent memory cell and always turned off, wherein the storage transistor is always turned on;
a wordline coupled to a gate of the access transistor of each said sub-cell;
complementary bit lines respectively coupled to sources/drains of the access transistors of the pair of sub-cells, such that data bit may be accessed between the bit line and the corresponding storage transistor through the corresponding access transistor;
a precharge circuit coupled between the complementary bit lines, the precharge circuit, when activated, being configured to precharge the complementary bit lines toward a voltage level; and
a sense amplifier coupled between the complementary bit lines, the sense amplifier, when activated, being configured to drive the complementary bit lines toward the power and ground respectively.

10. The memory device of claim 9, wherein the access transistor, the storage transistor and the isolation transistor are N-type metal-oxide-semiconductor (MOS) transistors.

11. The memory device of claim 9, wherein the access transistor, the storage transistor and the isolation transistor are P-type metal-oxide-semiconductor (MOS) transistors.

12. The memory device of claim 11, wherein a gate of the storage transistor is coupled to ground.

13. The memory device of claim 11, wherein a gate of the isolation transistor is coupled to power.

14. The memory device of claim 9, wherein complementary data bits are respectively stored in the storage transistors of the pair of the sub-cells.

15. The memory device of claim 9, wherein the sources/drains of the access transistors that are not connected to the storage transistors are coupled to the complementary bit lines respectively.

16. The memory device of claim 9, wherein the sources/drains of the isolations transistors that are not connected to the storage transistors are respectively coupled to the storage transistors of the sub-cells of the adjacent memory cell.

* * * * *